United States Patent [19]
Lane

[11] Patent Number: 5,834,849
[45] Date of Patent: Nov. 10, 1998

[54] HIGH DENSITY INTEGRATED CIRCUIT PAD STRUCTURES

[75] Inventor: Christopher F. Lane, Campbell, Calif.

[73] Assignee: Altera Corporation, San Jose, Calif.

[21] Appl. No.: 600,339

[22] Filed: Feb. 13, 1996

[51] Int. Cl.$^6$ .......................... H01L 23/48; H01L 23/52; H01L 29/40
[52] U.S. Cl. ........................... 257/786; 257/774; 257/778
[58] Field of Search .................................. 257/778, 786, 257/774

[56] References Cited

U.S. PATENT DOCUMENTS

| | | | |
|---|---|---|---|
| 3,795,845 | 3/1974 | Cass et al. | 257/786 |

FOREIGN PATENT DOCUMENTS

| | | | |
|---|---|---|---|
| 415541 | 3/1991 | European Pat. Off. | 257/778 |
| 62-42441 | 2/1987 | Japan | 257/786 |
| 62-43160 | 2/1987 | Japan | 257/786 |
| 63-62340 | 3/1988 | Japan | 257/786 |
| 1298731 | 12/1989 | Japan | 257/786 |
| 3-72651 | 3/1991 | Japan | 257/786 |
| 3-82129 | 4/1991 | Japan | 257/786 |
| 3280441 | 12/1991 | Japan | 257/786 |
| 4368175 | 12/1992 | Japan | 257/786 |
| 5335536 | 12/1993 | Japan | 257/786 |

OTHER PUBLICATIONS

"C–4 Solder Chip Connection, Preliminary Data," Technology Products, IBM, Armonk, New York, Jan. 8, 1993.

"Solder Bumping Flow," APTOS Corporation, Milpitas, California (undated).

"Wafer Bumping Service," Brochure of APTOS Corporation, Milpitas. California (undated).

Primary Examiner—Mahshid D. Saadat
Assistant Examiner—T. M. Arroyo
Attorney, Agent, or Firm—Fish & Neave; Robert R. Jackson; G. Victor Treyz

[57] ABSTRACT

An integrated circuit with high density pad structures is provided. The circuit has circuitry covered by an insulating layer. Pads are formed on the insulating layer overlapping the circuitry. A pattern of holes in the insulating layer allows electrical connections to be formed between the pads and the underlying circuitry. Because the pads are formed on top of the circuitry, the die area occupied by pads is reduced relative to the die area occupied by circuitry. The pads are suitable for flip-chip bonding to a package such as a multichip module or conventional wire bonding.

7 Claims, 4 Drawing Sheets

HIGH DENSITY INTEGRATED CIRCUIT PAD STRUCTURES

BACKGROUND OF THE INVENTION

This invention relates to integrated circuit pad structures, and more particularly, to integrated circuit pad structures that allow a relatively large number of input/output pads to be provided on an integrated circuity of a given die size.

Integrated circuit fabrication technology is continually improving, which creates a need to accommodate integrated circuits of increasing density and complexity. One area of concern relates to providing a sufficient density of input/output pads for complex circuits. With conventional techniques, bonding pads are arranged around the periphery of a circuit. The bonding pads must have a minimum size and a minimum center-to-center spacing to allow bonding wires to be attached properly. The minimum die size of many integrated circuits is limited, because it is necessary to provide space for bonding pads about the periphery of the die.

In order to provide greater densities of pads, packaging schemes such as flip-chip mounting have been developed, which allow input/output connections for a circuit to be provided by arrays of solder balls, rather than peripheral bonding pads. If desired, the flip-chip solder balls may be interspersed with the circuitry of the integrated circuit. Although such schemes generally provide greater densities of input/output connections than are available using conventional peripheral bonding pads, forming the solder ball array consumes a significant fraction of the die area available for the active circuitry of the integrated circuit.

It is therefore an object of the present invention to provide improved integrated circuit pad structures.

It is a further object of the present invention to provide integrated circuit pad structures that occupy a reduced portion of the integrated circuit die area.

SUMMARY OF THE INVENTION

These and other objects of the invention are accomplished in accordance with the principles of the present invention by providing an integrated circuit with high density pad structures. Circuitry on the surface of the die that forms the integrated circuit is covered with an insulating layer. A pattern of pads is formed on the insulating layer overlapping the circuitry. Holes in the insulating layer allow the pads to be electrically connected to the underlying circuitry.

The pads preferably allow the integrated circuit to be flip-chip mounted to a multichip module or other flip-chip compatible package. Because the pads are formed on top of the circuitry, the pads consume significantly less silicon die area than conventional flip-chip pads, which are formed directly on the die surface itself. Accordingly, the approach of the present invention allows a greater density of pads to be provided than with conventional flip-chip mounting.

Further features of the invention, its nature and various advantages will be more apparent from the accompanying drawings and the following detailed description of the preferred embodiments.

DETAILED DESCRIPTION OF THE PREFERRED EMBODIMENTS

Conventional integrated circuit 20 contains circuitry 22 in the interior of circuit 20 that is connected to peripheral bonding pads 24 by conductors 26 and by signal routing lines (not shown separately) contained within circuitry 22. Bonding pads 24 must have a minimum size and be spaced with a minimum pitch to allow wire bonds to be formed between pads 24 and a suitable integrated circuit package (not shown). Circuit layouts such as that of circuit 20 become is bonding pad limited when the die size of integrated circuit 20 cannot be reduced as much as desired due to the need to provide sufficient area for bonding pads 24 around the periphery of circuit 20. In addition, the signal routing lines within circuitry 22 can become fairly long, which increases circuit delay times.

Figure 1:
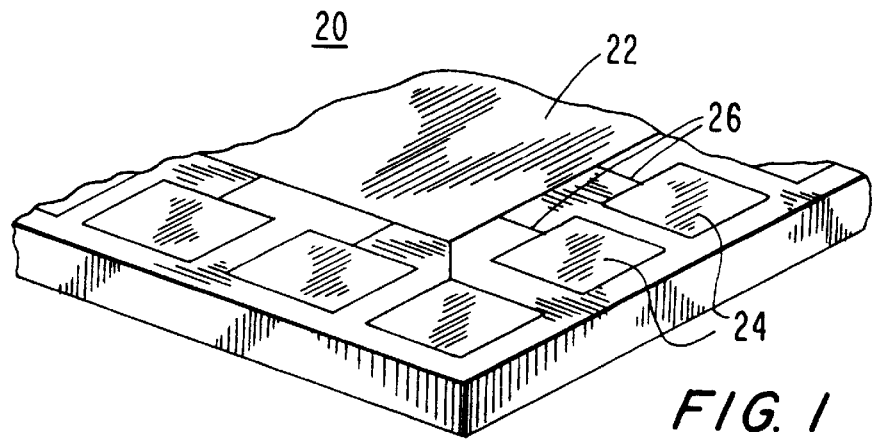
FIG. 1 is perspective view of an integrated circuit with conventional peripheral bonding pads.
Figure 2:
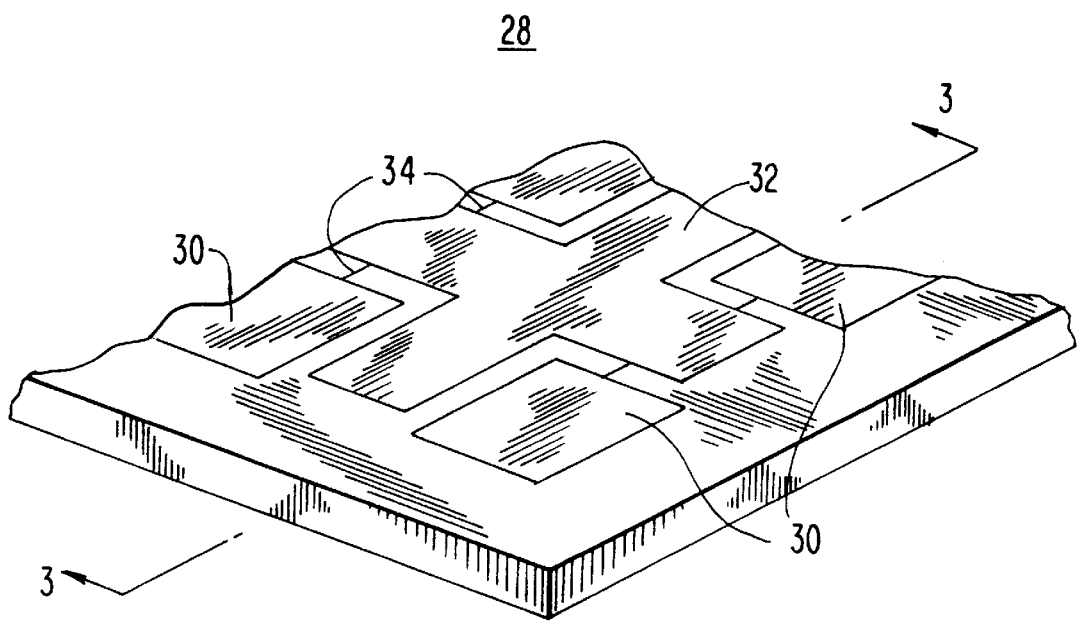
FIG. 2 is a perspective view of an integrated circuit with pads for forming a conventional flip-chip solder ball array.

One conventional approach for increasing the density of pads 24 and reducing the length of the signal routing lines in circuitry 22 is flip-chip mounting. As shown in FIG. 2, flip-chip integrated circuit 28 has pads 30 interspersed throughout circuitry 32. Conductors 34 and signal routing lines within circuitry 32 connect circuitry 32 to pads 30. Pads 30 must be large enough to accommodate solder ball connections, and are therefore somewhat larger than bonding pads 24 of circuit 20 (FIG. 1). However, pads 30 can be provided in a high-density array, which allows a greater number of input/output connections to be formed than is possible using peripheral bonding pads. Because pads 30 are interspersed with circuitry 32, the signal routing lines in circuitry 32 that are used to provide signals to pads 30 are shorter than the comparable signal routing lines used to connect circuitry 22 to bonding pads 24 (FIG. 1). Reducing the length of the signal routing lines in circuitry 32 reduces the circuit delays associated with the signal routing lines.

Figure 3:
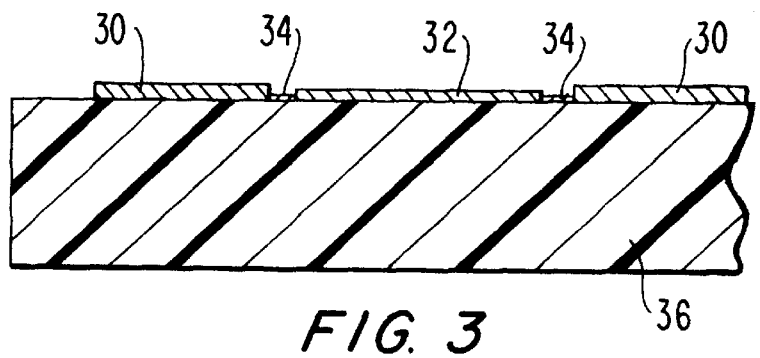
FIG. 3 is a cross sectional view of the integrated circuit of FIG. 2.

As shown in FIG. 3, pads 30 of circuit 28 are formed directly on silicon die 36. Because pads 30 and circuitry 32 both occupy surface area on silicon die 36, the die area occupied by pads 30 represents die area that cannot be occupied by circuitry 32.

Figure 4:
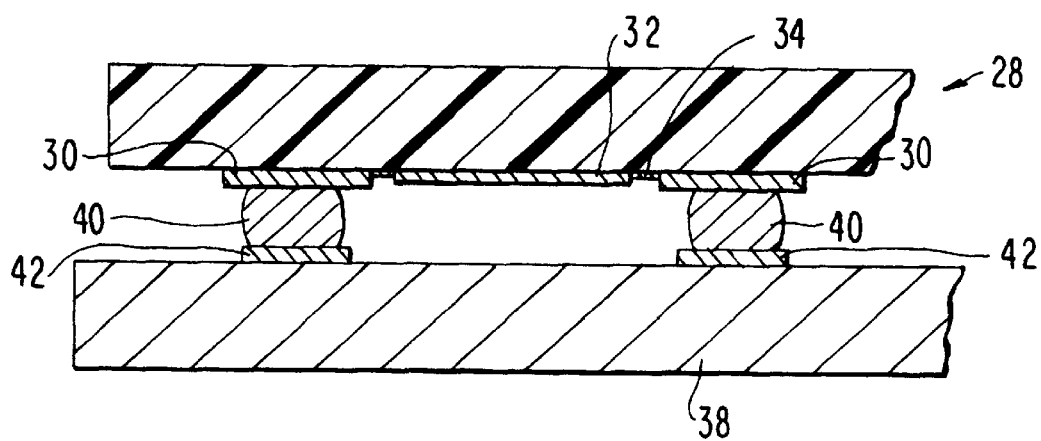
FIG. 4 is a cross sectional view of the integrated circuit of FIGS. 2 and 3 mounted to a package.

Circuit 28 is mounted on package 38 using an array of solder balls 40, as shown in FIG. 4. Package 38 is a multichip module or other flip-chip compatible package. Solder balls 40 form electrical connections between pads 30 of circuit 28 and pads 42 of package 38. Internal routing lines (not shown) in package 38 are used to route signals from circuit 28 to the other components in the electrical system in which circuit 28 is being used.

Figure 5:
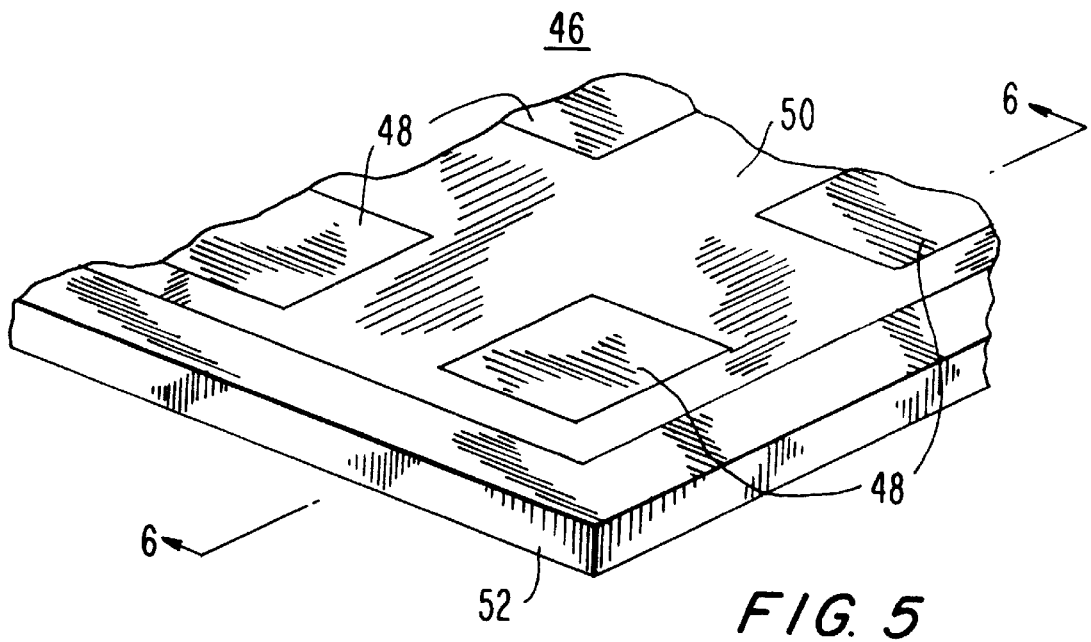
FIG. 5 is a perspective view of an integrated circuit in accordance with the present invention showing pads formed on top of the active circuitry of the integrated circuit.

Circuit 46 of the present invention has pads 48 that overlap circuitry 50, as shown in FIG. 5. Pads 48 are preferably comparable in area to conventional flip-chip pads 30 of circuit 28 (FIGS. 2–4), but because pads 48 are formed on top of circuitry 50, pads 48 and circuitry 50 do not compete for area on silicon die 52.

Figure 6:
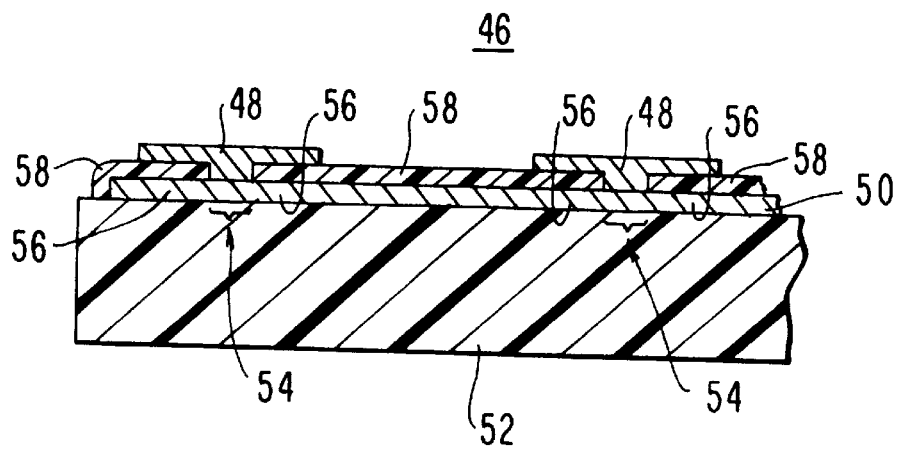
FIG. 6 is a cross sectional view of the integrated circuit of FIG. 5.

As shown in FIG. 6, pads 48 occupy significantly less die area on circuit 46 than is occupied by pads 30 of circuit 28 (FIGS. 2–4), because each pad 48 only contacts a small portion 54 of the circuitry 50 to form the connection between circuitry 50 and pads 48. The remaining portions of pads 48 are separated from circuitry 50 by insulating layer 58. As a result, the die area under much of pads 48 can be occupied with portions of active circuitry 56. With conventional flip-chip pads 30 (FIGS. 2–4), there is no area available under pads 30, because pads 30 are formed directly on silicon die 36. Using the pad arrangement of FIG. 6, more circuitry can be provided on a die of a given area or the die area of a given circuit can be reduced.

Insulating layer 58 may be formed from any suitable insulating material, such as silicon dioxide. Circuitry 50, insulating layer 58, and pads 48 can be formed using conventional semiconductor fabrication techniques. If desired, pads 48 may be formed on top of portions of circuitry 50 that are relatively insusceptible to noise.

Figure 7:
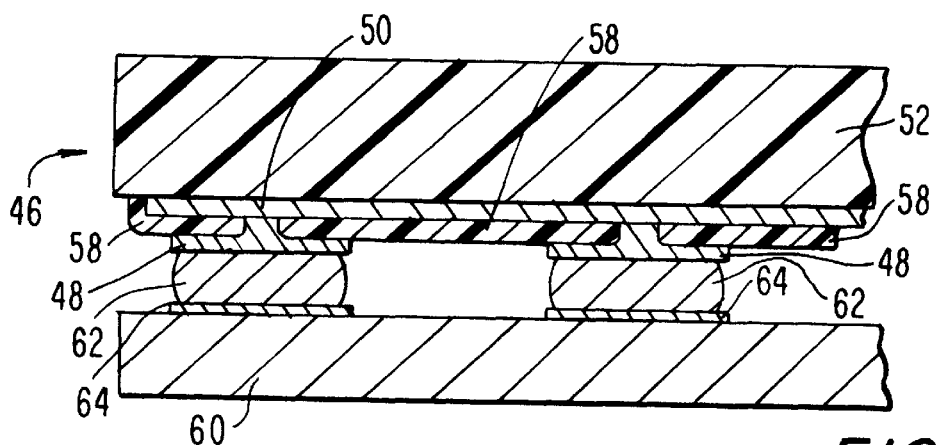
FIG. 7 is a cross sectional view of the integrated circuit of FIGS. 5 and 6 mounted to a package.

As shown in FIG. 7, circuit 46 is mounted on package 60 with an array of solder balls 62 using conventional flip-chip solder ball mounting techniques. Solder balls 62 form electrical connections between pads 48 of circuit 46 and pads 64 of package 60. Internal routing lines (not shown) in package 60 interconnect pads 64 with other portions of the electrical system formed using package 60.

Figure 8:
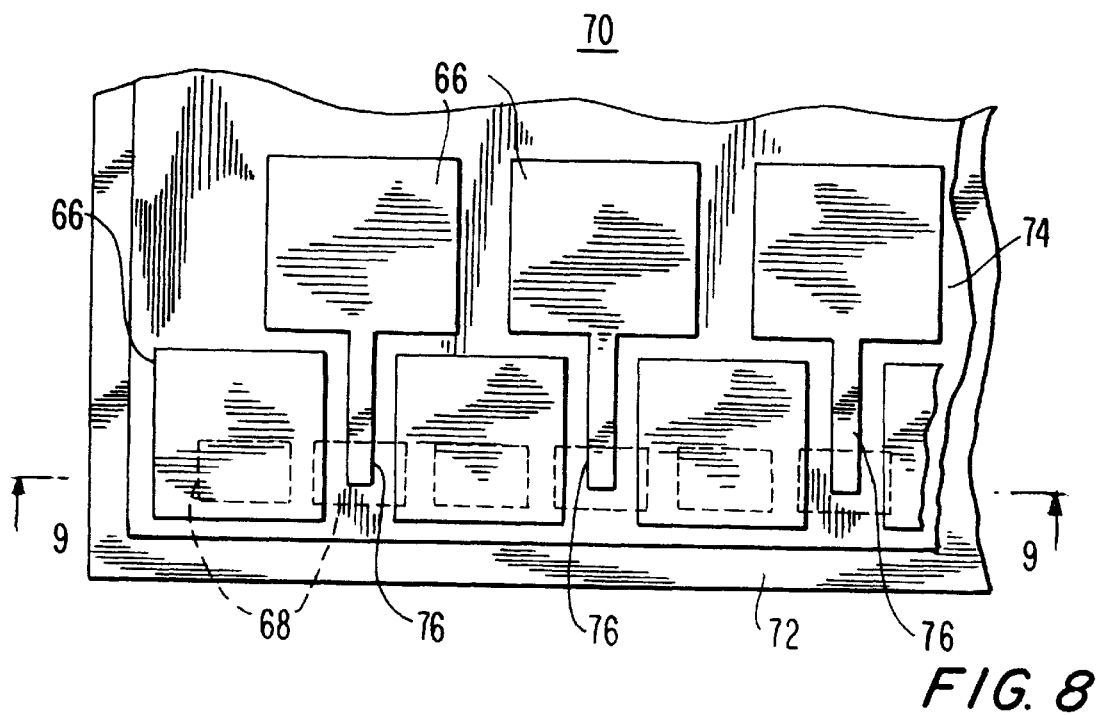
FIG. 8 is a plan view of an integrated circuit with pads formed in accordance with the present invention showing the pads connected to peripheral input/output connections of underlying circuitry.

If desired, pads 48 may be formed in the pattern of an array on the surface of circuit 46, as shown in FIG. 5. Alternatively, pads 66 may be connected to input/output connections 68 about the periphery of circuit 70, as shown in FIG. 8. Input/output connections 68 are formed on silicon die 72 and are connected to the active circuitry (not shown) of circuit 70. Pads 66 are formed on top of insulating layer 74.

Forming input/output connections 68 and pads 66 in a peripheral pattern allows the circuit 70 to be formed using a preexisting circuit layout, such as a circuit layout designed for use with peripheral bonding pads. A preexisting circuit layout having peripheral bonding pads can be modified for use with a peripheral pattern of pads 66 such as shown in FIG. 8 by reducing the size of the peripheral bonding pads to form input/output connections 68. Using a peripheral pattern of pads 66 also allows conventional wire bonds to be made to pads 66, if desired, rather than flip-chip solder ball connections.

Figure 9:
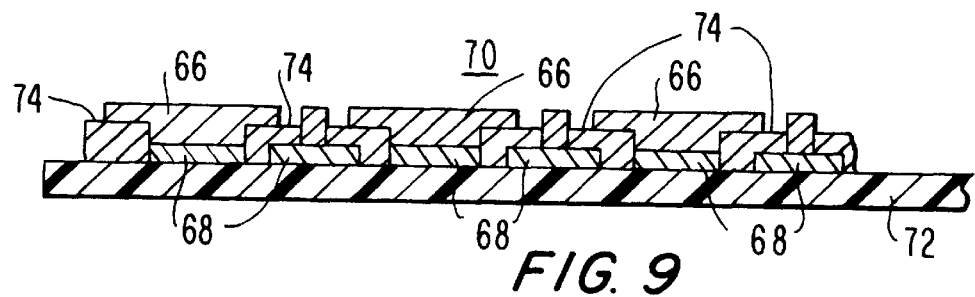
FIG. 9 is a cross sectional view of the integrated circuit of FIG. 8.

In order to form the double row pattern of pads 66 shown in FIG. 8, the pads 66 in the inner row have extended portions 76 connected to input/output connections 68. As shown in FIG. 9, input/output connections 68 underlying the outer row of pads 66 are directly connected to pads 66. If desired, multiple layers of insulators and routing conductors may be used to provide additional rows of pads 66 connected to peripheral input/output connections 68. The pattern of pads 66 may also be made compatible with the patterns used for popular package technologies, such as ball grid array packages.

The foregoing is merely illustrative of the principles of this invention and various modifications can be made by those skilled in the art without departing from the scope and spirit of the invention.

What is claimed is:

1. An integrated circuit, comprising:

a die having an upper surface;

circuitry formed on the upper surface of said die;

an insulating layer disposed on said circuitry and having a plurality of holes; and a plurality of pads on said insulating layer overlapping said circuitry and electrically connected to said circuitry through said holes, wherein said pads are arranged in an inner row and an outer row, said inner row of pads further comprising extended portions for connecting to said circuitry through said holes in said insulating layer.

2. The integrated circuit defined in claim 1 wherein said extended portions extend radially outward between said pads in said outer row.

3. The integrated circuit defined in claim 1 wherein each of said holes through which said extended portions of said inner row of pads connect to said circuitry is disposed between a respective pair of said pads in said outer row.

4. The integrated circuit defined in claim 1 wherein said pads are solder ball pads for flip-chip mounting said integrated circuit.

5. The integrated circuit defined in claim 1 wherein said pads are bonding pads.

6. An integrated circuit, comprising:

a die having an upper surface;

circuitry formed on the upper surface of said die;

an insulating layer disposed on said circuitry and having a plurality of holes; and a plurality of pads on said insulating layer overlapping said circuitry and electrically connected to said circuitry through said holes, wherein said pads are disposed in a two-dimensional array of intersecting rows and columns of said pads, said array having more than two rows and more than two columns.

7. The integrated circuit defined in claim 6 wherein said pads are solder ball pads for flip-chip mounting said integrated circuit.

* * * * *